(12) United States Patent
Hsu et al.

(10) Patent No.: US 9,156,947 B2
(45) Date of Patent: Oct. 13, 2015

(54) ORGANIC SEMICONDUCTOR MATERIAL AND THIN-FILM TRANSISTOR

(71) Applicant: Au Optronics Corporation, Hsinchu (TW)

(72) Inventors: Chain-Shu Hsu, Hsinchu (TW); Jhong-Sian Wu, Changhua County (TW); Jyun-Fong Jheng, Taichung (TW); Chien-Lung Wang, Hsinchu (TW); Ching-Yang Liu, New Taipei (TW); Yao-Min Liu, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 97 days.

(21) Appl. No.: 14/013,048

(22) Filed: Aug. 29, 2013

(65) Prior Publication Data

US 2014/0312317 A1  Oct. 23, 2014

(30) Foreign Application Priority Data

Apr. 19, 2013  (TW) .............................. 102113993 A

(51) Int. Cl.
*C08G 75/32* (2006.01)
*H01L 51/05* (2006.01)
*H01L 51/00* (2006.01)
*C08G 75/00* (2006.01)

(52) U.S. Cl.
CPC ............ *C08G 75/32* (2013.01); *H01L 51/0036* (2013.01); *H01L 51/0043* (2013.01); *H01L 51/0558* (2013.01)

(58) Field of Classification Search
CPC ...................................................... C08G 75/32
USPC .............................................. 257/40; 528/380
See application file for complete search history.

(56) References Cited

FOREIGN PATENT DOCUMENTS

CN   103030790   4/2013
TW   201229085   7/2012

OTHER PUBLICATIONS

Jheng et al., "Influences of the Non-Covalent Interaction Strength on Reaching High Solid-State Order and Device Performance of a Low Bandgap Polymer with Axisymmetrical Structural Units," Advanced Materials, vol. 25, Issue 17, May 7, 2013, pp. 2445-2451.

*Primary Examiner* — Duc Truong
(74) *Attorney, Agent, or Firm* — Jianq Chyun IP Office

(57) ABSTRACT

An organic semiconductor material is provided. The organic semiconductor material includes a compound represented by formula (1):

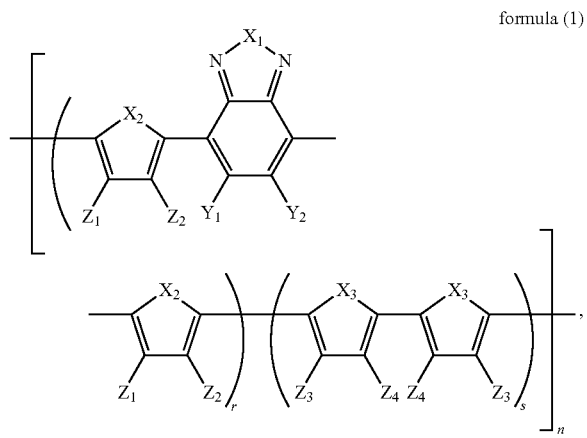

wherein r and s each independently represent a positive integer of 1 to 20; n represents a positive integer of 2 to 10000; $X_1$, $X_2$ and $X_3$ each independently represent O, S, Se, Te, NR, RCR, RSiR, RGeR or RSnR; $Y_1$ and $Y_2$ each independently represent H, F, Cl, $CF_3$, haloalkyl, CN, R, OR, SR, COOR or COR; and $Z_1$, $Z_2$, $Z_3$ and $Z_4$ each independently represent H, F, Cl, $CF_3$, haloalkyl, CN, R, OR, SR, COOR or COR, wherein R represents alkyl group.

4 Claims, 4 Drawing Sheets

ORGANIC SEMICONDUCTOR MATERIAL AND THIN-FILM TRANSISTOR

CROSS-REFERENCE TO RELATED APPLICATION

This application claims the priority benefit of Taiwan application serial no. 102113993, filed on Apr. 19, 2013. The entirety of the above-mentioned patent application is hereby incorporated by reference herein and made a part of this specification.

BACKGROUND

1. Field of the Application

The invention relates to a semiconductor material, and more particularly, to an organic semiconductor material and a thin film transistor.

2. Description of Related Art

Since organic thin-film transistor (OTFT) has characteristics of being thin and light, flexible and low in process temperature, it has been broadly applied to the uses of liquid crystal display, organic light emitting display and electrophoretic display apparatus.

However, patents and sources of organic materials used in the current organic thin film transistors are mainly and mostly lay in the hands of international companies, such that the materials are difficult to be obtained. In order to have autonomy in the technology of the organic thin film transistors, the development of novel organic material with favorable characteristics is currently the most eager developmental goal in this related field.

SUMMARY OF THE APPLICATION

The invention provides an organic semiconductor material not susceptible to the influences of water and oxygen and having a favorable stability.

The invention further provides a thin film transistor having the aforesaid organic semiconductor material.

The invention provides an organic semiconductor material including a compound represented by formula (1):

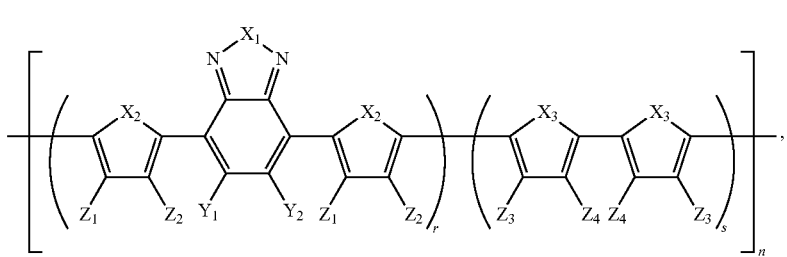

formula (1)

wherein r and s each independently represent a positive integer of 1 to 20, n represents a positive integer of 2 to 10000, $X_1$, $X_2$ and $X_3$ each independently represent O, S, Se, Te, NR, RCR, RSiR, RGeR or RSnR, $Y_1$ and $Y_2$ each independently represent H, F, Cl, $CF_3$, haloalkyl, CN, R, OR, SR, COOR or COR, and $Z_1$, $Z_2$, $Z_3$ and $Z_4$ each independently represent H, F, Cl, $CF_3$, haloalkyl, CN, R, OR, SR, COOR or COR, wherein R represents alkyl group.

The invention further provides a thin film transistor including a gate, a drain, a source and an organic semiconductor layer. The organic semiconductor layer is located between the gate, the source and the drain, wherein the organic semiconductor layer includes an organic semiconductor material represented by formula (1):

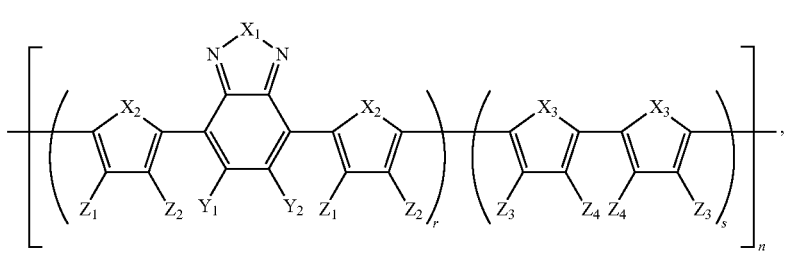

formula (1)

wherein r and s each independently represent a positive integer of 1 to 20, n represents a positive integer of 2 to 10000, $X_1$, $X_2$ and $X_3$ each independently represent O, S, Se, Te, NR, RCR, RSiR, RGeR or RSnR, $Y_1$ and $Y_2$ each independently represent H, F, Cl, $CF_3$, haloalkyl, CN, R, OR, SR, COOR or COR, and $Z_1$, $Z_2$, $Z_3$ and $Z_4$ each independently represent H, F, Cl, $CF_3$, haloalkyl, CN, R, OR, SR, COOR or COR, wherein R represents alkyl group.

According to the foregoing, the organic semiconductor material and the thin film transistor provided by the embodiments of the invention are a novel organic semiconducting polymer material and a novel organic thin film transistor. Moreover, effects of the organic semiconductor material and the thin film transistor provided by the embodiments of the invention are not susceptible to the influences of water and oxygen in an atmosphere, and thus have favorable stabilities.

In order to make the abovementioned and other features and advantages of the present application more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Organic Semiconductor Material

Figure 1:
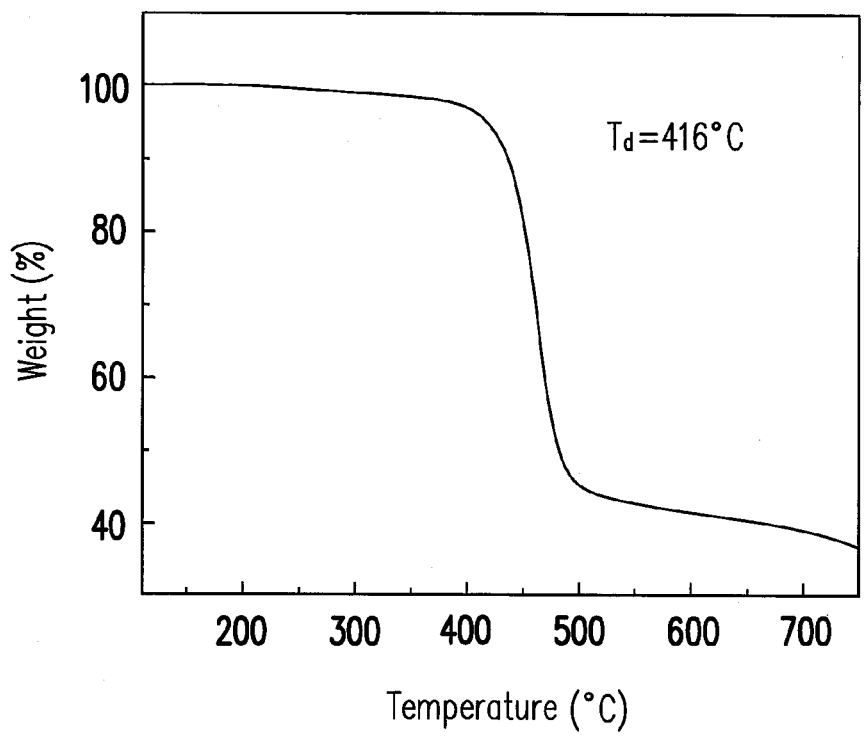
FIG. 1 is a thermogravimetric graph of a polymer compound of formula (2).

An organic semiconductor material of an embodiment of the invention includes a compound represented by formula (1):

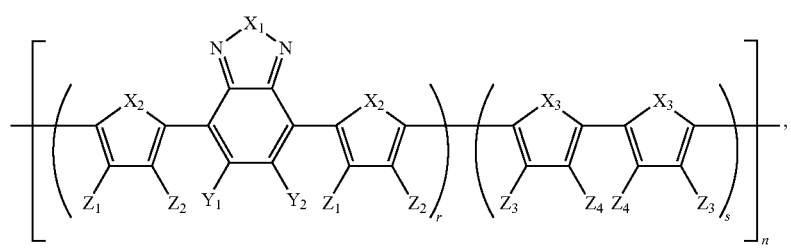

formula (1)

wherein r and s each independently represent a positive integer of 1 to 20, n represents a positive integer of 2 to 10000, $X_1$, $X_2$ and $X_3$ each independently represent O, S, Se, Te, NR, RCR, RSiR, RGeR or RSnR, $Y_1$ and $Y_2$ each independently represent H, F, Cl, $CF_3$, haloalkyl, CN, R, OR, SR, COOR or COR, and $Z_1$, $Z_2$, $Z_3$ and $Z_4$ each independently represent H, F, Cl, $CF_3$, haloalkyl, CN, R, OR, SR, COOR or COR, wherein R represents alkyl group. Moreover, in the present embodiment, $X_1$ may be identical to or different from each $X_2$, $X_3$, each $X_2$ may be identical to each other or different, and each $X_3$ may be identical to each other or different.

In the present embodiment, a molecular weight of the compound represented by formula (1), for example, is from about $10^3$ to about $10^5$. Moreover, the compound represented by formula (1) is a conjugated polymer. Generally, in the conjugated polymer, since a binding energy of a delocalized π electron in a conjugated system is much lower than that of a localized electron, the conjugated polymer has a favorable charge-transporting ability; and thereby, a carrier mobility of a semiconductor device is enhanced.

Moreover, in the compound represented by formula (1), r is 1, for example, and s is 1, for example, but the invention is not limited thereto. In other embodiments, r may also be a positive integer of 2 to 20, and s may also be a positive integer of 2 to 20; or r and s may also respectively be one of the positive integers of 2 to 20.

In an embodiment, the organic semiconductor material includes a polymer compound PTh$_4$FBT(poly {(5,6-difluorobenzo-2,1,3-thiadiazole-4,7-diyl)-alt-(3',4''-di-(2-octyldode cyl)-2,2';5',2'';5'',2'''-quaterthiophene-5,5'''-diyl)}) represented by formula (2) below:

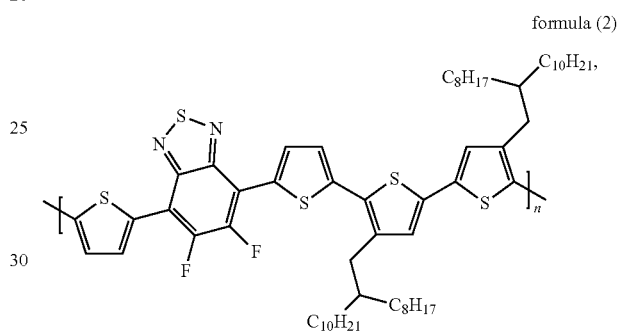

formula (2)

wherein n represents a positive integer of 2 to 10000.

Specifically, in corresponding to the compound represented by formula (1), $X_1$, each $X_2$ and each $X_3$ of the polymer compound of formula (2) are all S, but the invention is not limited thereto. One of ordinary skill in the art should be understood that, according to actual demands in the organic semiconductor material, $X_1$, $X_2$ and $X_3$ may each independently represent O, S, Se, Te, NR, RCR, RSiR, RGeR or RSnR, and $X_1$ may be identical to or different from $X_2$ or $X_3$, and each $X_2$ may be identical to each other or different, and each $X_3$ may be identical to each other or different. Moreover, in corresponding to the compound represented by formula (1), the polymer compound of formula (2) is a polymer compound that r is 1 and s is 1. In addition, a molecular weight of the polymer compound of formula (2) is about 30000.

Synthesis Method of Organic Semiconductor Material

Synthesis Example 1

A synthesis method of the abovementioned polymer compound of formula (2) is taken as an example for describing a synthesis method of the organic semiconductor material in detail below. However, the invention is not limited to the contents disclosed herein.

Synthesis of Monomer (M1)

Firstly, a compound (b) is synthesized, and a synthesis reaction formula thereof is as follows:

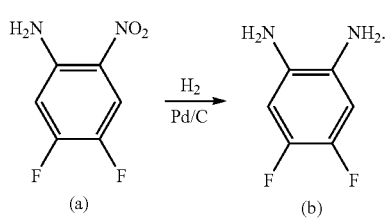 [SMILES: Nc1cc(F)c(F)cc1[N+](=O)[O-] ; "H2" ; Nc1cc(F)c(F)cc1N]

More specifically, the synthesis reaction of the compound (b) includes the following steps. Firstly, a compound (a) (10 g, 57.44 mmol) and solvent methanol (200 mL) are placed in a 500 mL single-neck bottle, and then Pd/C (1 g) is slowly added into the mixed solution. Next, after Pd/C is completely dispersed in the solution, the solution is added with acetic acid (20 mL), degassed with hydrogen for 15 minutes, and then reacted under a hydrogen environment for 3 days. Afterward, Pd/C is removed by filtration through gravity, and methanol is removed through rotary evaporation. Subsequently, an extraction is performed with ethyl acetate (100 mL×3) and sodium carbonate aqueous solution (100 mL), and an organic layer is collected. Then, the collected organic layer is dewatered with magnesium sulfate, organic solvent is removed through rotary evaporation, and finally, ethyl acetate/N-hexane (1:1) is used as an eluent to perform a purification via silicone column chromatography, so as to obtain the compound (b) (7.86 g, 95% yield) that is presented as brown solids. $^1$H NMR (400 MHz, CDCl$_3$):δ(ppm) 6.52 (t, J=9.6 Hz, 2H), 3.31 (br, 4H).

Next, a compound (c) is synthesized, and a synthesis reaction formula thereof is as follows:

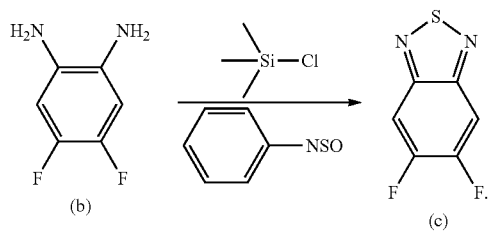

More specifically, the synthesis reaction of the compound (c) includes the following steps. Firstly, the compound (b) (2 g, 13.88 mmol) and pyridine (40 mL) being used as the solvent are placed in a 100 mL double-neck bottle, and then chlorotrimethylsilane (2.27 g, 30.51 mmol) and N-thionylaniline (2.12 g, 15.26 mmol) are added to form a mixture. Next, a reflux tube is racked up, and the mixture is heated under reflux at 80° C. for 16 hours. Afterward, the temperature is slowly lowered back to the room temperature. Subsequently, the reaction mixture is slowly poured into ice water, so as to be presented as purple-black solids with white flakes. Then, after impurities in the abovementioned solids are washed away by using alcohol/water (1:1) as washing fluid, the solids are air-dried so as to obtain the compound (c) (1.2 g, 50% yield) that is presented as purple-black solids with white flakes. $^1$H NMR (400 MHz, CDCl$_3$):δ(ppm) 7.76 (t, J=8.8 Hz, 2H).

Subsequently, a compound (d) is synthesized, and a synthesis reaction formula thereof is as follows:

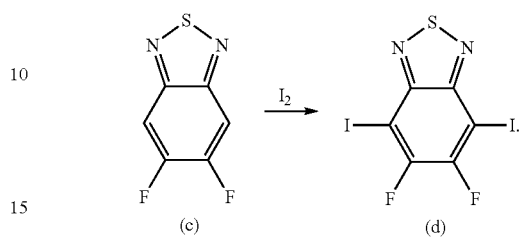

More specifically, the synthesis reaction of the compound (d) includes the following steps. Firstly, the compound (c) (0.5 g, 2.9 mmol) and iodine (2.95 g, 11.61 mmol) are placed in a 50 mL single-neck bottle, and then fuming sulfuric acid (20 mL) used as the solvent is added into the single-neck bottle to form the mixture solution. The mixture solution is then reacted under 60° C. for 16 hours. Later, after the temperature is lowered back to the room temperature, the reaction mixture is slowly poured into crushed ice and then extracted with ethyl acetate (300 mL×3) and sodium hydroxide aqueous solution (500 mL), and an organic layer is collected. Finally, after the organic layer is stirred with sodium thiosulfate aqueous solution for 24 hours, an aqueous layer and organic solvent are removed, so as to obtain the compound (d) (1.0 g, 82% yield) that is presented as pale yellow solids.

Then, a compound (e) is synthesized, and a synthesis reaction formula thereof is as follows:

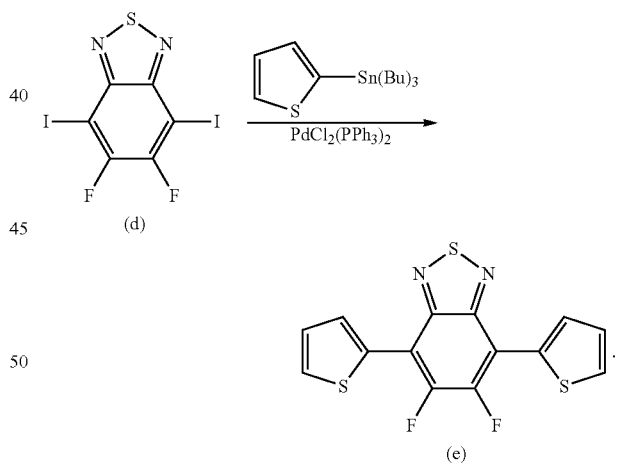

More specifically, the synthesis reaction of the compound (e) includes the following steps. Firstly, the compound (d) (0.5 g, 1.15 mmol) and PdCl$_2$(PPh$_3$)$_2$ (0.073 g, 0.104 mmol) are placed in a 100 mL double-neck bottle, and then pre-degassed tetrahydrofuran (THF) (50 mL) and 2-(tributylstannyl)thiophene (1 g, 2.68 mmol) solvents are added to the double-neck bottle to form the mixture solution. The mixture solution is reacted under 70° C. for 24 hours. Afterward, ethyl acetate/N-hexane (1:10) is used as an eluent to perform a purification via the silicone column chromatography, and a recrystallization is performed with alcohol after the purification, so as to obtain the compound (e) (0.3 g, 76% yield) that is presented as orange solids. $^1$H NMR (400 MHz, CDCl$_3$):δ (ppm) 8.28 (d, J=4.8 Hz, 2H), 7.61 (d, J=6.8 Hz, 2H), 7.58 (d, J=6.8 Hz, 2H).

Afterward, a monomer (M1) is synthesized, and a synthesis reaction formula thereof is as follows:

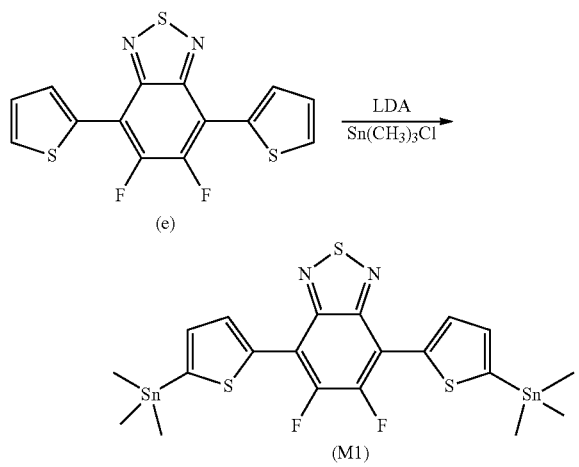

More specifically, the synthesis reaction of the monomer (M1) includes the following steps. Firstly, the compound (e) (0.3 g, 0.89 mmol) is placed in a 100 mL double-neck bottle, and the bottle is repeated vacuumed and baked for 3 times. Afterward, anhydrous tetrahydrofuran (50 mL) is injected, and then under the temperature of −78° C. (mixing liquid nitrogen with acetone), lithium diisopropylamide (LDA) (2 M, 1.34 mL, 2.68 mmol) is slowly dropwise added into the mixed solution to be continuously reacted for 1 hour. Next, chlorotrimethylstannane (1.0 M, 4.46 mL, 4.46 mmol) is also added under −78° C. into the mixed solution to be continuously reacted for 12 hours after the temperature returns back to the room temperature. Then, water is added to stop the reaction, organic solvent is removed through rotary evaporation, an extraction is performed with ether (50 mL×3) and pure water (50 mL), an organic layer is collected and dewatered with magnesium sulfate, and the organic solvent is removed through rotary evaporation, so as to obtain the monomer (M1) (0.4 g, 68% yield) that is presented as orange solids. $^1$H NMR (400 MHz, CDCl$_3$):δ(ppm) 8.35 (d, J=3.6 Hz, 2H), 7.36 (d, J=3.6 Hz, 2H), 0.45 (s, 18H).

Synthesis of Monomer (M2)

Firstly, a compound (g) is synthesized, a synthesis reaction formula thereof is as follows:

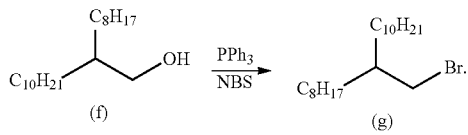

More specifically, the synthesis reaction of the compound (g) includes the following steps. Firstly, the compound (f) (10 g, 33.5 mmol) and triphenylphosphine (17.9 g, 68.25 mmol) are placed in a 250 mL single-neck bottle, then dichloromethane (CH$_2$Cl$_2$) (22 mL) being used as the solvent is added, N-bromosuccinimide (NBS) (9.2 g, 51.69 mmol) is added under 0° C., and then after the temperature returns back to the room temperature, the reaction is performed for 24 hours. Next, dichloromethane is removed through rotary evaporation, and the product is dissolved out using N-hexane. Finally, N-hexane is used as an eluent to perform a purification via the silicone column chromatography, so as to obtain the compound (g) (11.47 g, 98% yield) that is presented as colorless liquid. $^1$H NMR (400 MHz, CDCl$_3$):δ(ppm) 3.45 (d, J=5.0 Hz, 2H), 1.59 (m, 1H), 1.4-1.2 (m, 32H), 0.88 (t, J=7.0 Hz, 6H).

Next, a compound (h) is synthesized, and a synthesis reaction formula thereof is as follows:

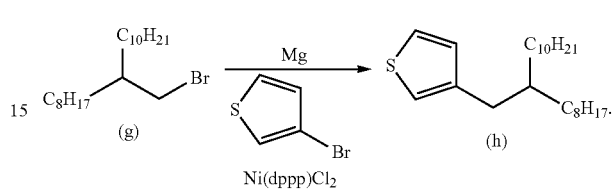

More specifically, the synthesis reaction of the compound (h) includes the following steps. Firstly, magnesium (0.313 g, 12.8 mmol) is placed in a double-neck bottle installed with a reflux tube, nitrogen is passed into the bottle after the bottle is backed under a vacuum condition, anhydrous tetrahydrofuran (30 mL) is added after repeating the above steps for three times, and then the compound (g)(10 g, 27.68 mmol) is added after adding an initiator 1,2-dibromoethane (0.1 mL). Afterward, the solution is heated under reflux to be reacted for 1 hours to 2 hours, until the magnesium is almost completely reacted, so as to complete a preparation of a Grignard reagent. It is noteworthy that the Grignard reagent must be used after the temperature is slowly lowered back to the room temperature. 1,3-Bis(diphenylphosphino)propane]nickel(II) chloride (0.2 g, 0.37 mmol) is placed into another double-neck bottle installed with the reflux tube, the nitrogen is passed into the bottle after the bottle is backed under the vacuum condition, anhydrous tetrahydrofuran (50 ml) and 3-bromothiophene (4.96 g, 30.5 mmol) are added after repeating the above steps for three times, and then the previously prepared Grignard reagent is slowly added. After the Grignard reagent is dropwise added, the solution is heated under reflux for 16 hours. Subsequently, an extraction is performed with ether/H$_2$O, then an organic solvent is removed through rotary evaporation after an aqueous layer is removed, and finally N-hexane is used as an eluent to perform a purification via silicone column chromatography, so as to obtain the compound (h) (5.1 g, 51% yield) that is presented as colorless liquid. $^1$H NMR (400 MHz, CDCl$_3$):δ(ppm) 3.45 (d, J=5.0 Hz, 2H), 1.59 (m, 1H), 1.4-1.2 (m, 32H), 0.88 (t, J=7.0 Hz, 6H).

Subsequently, a compound (i) is synthesized, and a synthesis reaction formula thereof is as follows:

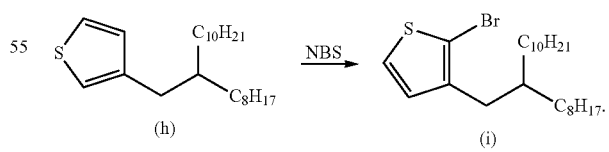

More specifically, the synthesis reaction of the compound (i) includes the following steps. Firstly, the compound (h) (4.9 g, 13.2 mmol) is placed in a 100 mL double-neck bottle, and N,N-dimethyl formamide (DMF) (15 mL) being used as the solvent is added. Next, the temperature is lowered to 0° C., and NBS (2.58 g, 14.5 mmol) soluble in DMF (15 mL) is slowly dropwise added into the solution under a nitrogen environment, so as to be reacted for 48 hours after the temperature is slowly returned back to the room temperature. Subsequently, an extraction is performed with N-hexane (100 mL×3) and ice water (100 mL), an organic layer is collected and dewatered with magnesium sulfate, the organic solvent is removed through rotary evaporation, and N-hexane is used as an eluent to perform a purification via silicone column chromatography, so as to obtain the compound (I) (5.6 g, 96% yield) that is presented as colorless liquid. $^1$HNMR(400 MHz, CDCl$_3$):δ(ppm) 7.17 (d, J=5.6 Hz, 1H), 6.75 (d, J=5.6 Hz, 1H), 2.48 (d, J=7.2 Hz, 2H), 1.64 (m, 1H), 1.30-1.25 (br, 32H), 0.88 (t, 6H).

Afterward, a monomer (M2) is synthesized, and a synthesis reaction formula thereof is as follows:

vacuum condition, dimethyl sulfoxide (20 mL) is added after repeating the above steps for three times, then the temperature is raised to 70° C., and the solution is reacted for 48 hours. Afterwards, an extraction is performed with ether/H$_2$O, the organic solvent is removed through rotary evaporation after an aqueous layer is removed, and finally N-hexane is used as an eluent to perform a purification via the silicone column chromatography, so as to obtain the monomer (M2) (0.5 g, 49% yield) that is presented as yellow liquid. $^1$H NMR (400 MHz, CDCl$_3$):δ(ppm) 6.8 (s, 2H), 2.49 (d, J=7.2 Hz, 4H), 1.67 (m, 2H), 1.30-1.27 (br, 64H), 0.88 (t, 12H).

Synthesis of Polymer Compound PTh$_4$FBT of Formula (2)

A synthesis reaction formula of a polymer compound PTh$_4$FBT of formula (2) is as follows:

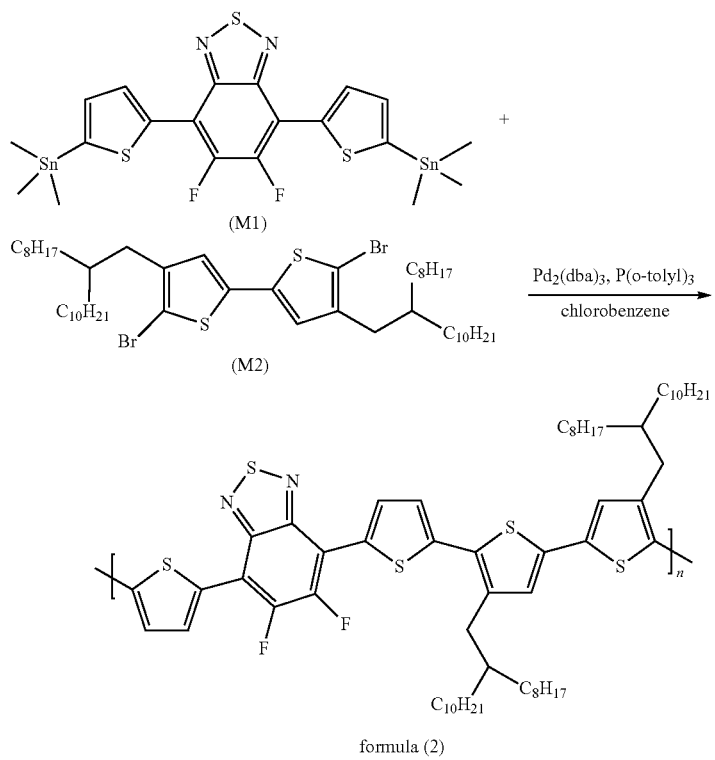

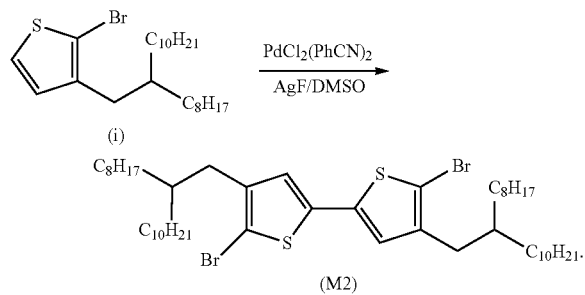

More specifically, the synthesis reaction of the monomer (M2) includes the following steps. Firstly, the compound (i) (1 g, 2.3 mmol), silver fluoride (0.6 g, 4.73 mmol) and PdCl$_2$(PhCN)$_2$ (17.3 mg, 0.05 mmol) are placed in a 50 mL double-neck bottle installed with a reflux tube, nitrogen is passed into the bottle after the bottle is baked under a lightless and More specifically, the synthesis reaction of the polymer compound of formula (2) includes the following steps. Firstly, the monomer (M1) (85.3 mg, 0.129 mmol), the monomer (M2) (114 mg, 0.129 mmol), tris(dibenzylideneacetone) dipalladium (5.9 mg, 0.05 mmol) and tris(2-methylphenyl) phosphine (15.7 mg, 0.4 mmol) are placed in a 50 mL single-neck bottle. Next, chlorobenzene (5 mL) pre-deoxygenated with nitrogen is injected, and after being continuously deoxygenated with nitrogen for 10 minutes, the bottle is further installed with a reflux tube and moved to a focused microwave synthesizer to perfomr a microwave polymerization; conditions for the polymerization are to perform a microwave polymerization reaction under 270 watt and 180° C. for 50 minutes. Then, end-capping 2-(tributylstannyl)thiophene (10.5 mg, 0.028 mmol) and 2-bromothiophene (20 mg, 0.123 mmol) are sequentially added, and both are to perform the microwave reactions under 270 watt and 180° C. for 10 minutes. Afterward, 200 mL of methanol is used to perform a reprecipitation, solids are collected using a filtration by gravity, and then after being continuously extracted with acetone for a day, continuously extracted with N-hexane for day and continuously extracted with tetrahydrofuran (THF) for a day, the solids are redissolved in O-dichlorobenzene (ODCB). Subsequently, 5 equivalents of Si-Thiol and magnet are added and stirred to perform metal removal for 12 hours. Next, after Si-Thiol is filtered out by gravity, a reprecipitation is performed with methanol, so as to obtain the polymer compound PTh$_4$FBT (90 mg, 45% yield) of formula (2) that is presented as dark green solids.

According to the above, the polymer compound of formula (2) formed with the abovementioned synthesis method is namely the polymer compound in formula (1) when r=1 and s=1.

Synthesis Example 2

Relevant descriptions regarding the synthesis method of the polymer compound in formula (1) when r=2 and s=1 are provided in the following below. The polymer compound synthesized by the synthesis method herein is such as a polymer compound represented by formula (3) (namely, in correspondence to the compound represented by formula (1), r is 2 and s is 1):

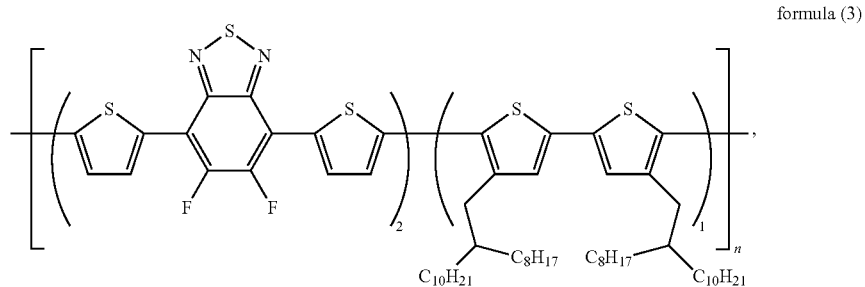

formula (3)

wherein n represents a positive integer of 2 to 10000. However, the invention is not limited to the contents disclosed herein.

A possible synthesis reaction formula for the polymer compound of formula (3) is as follows:

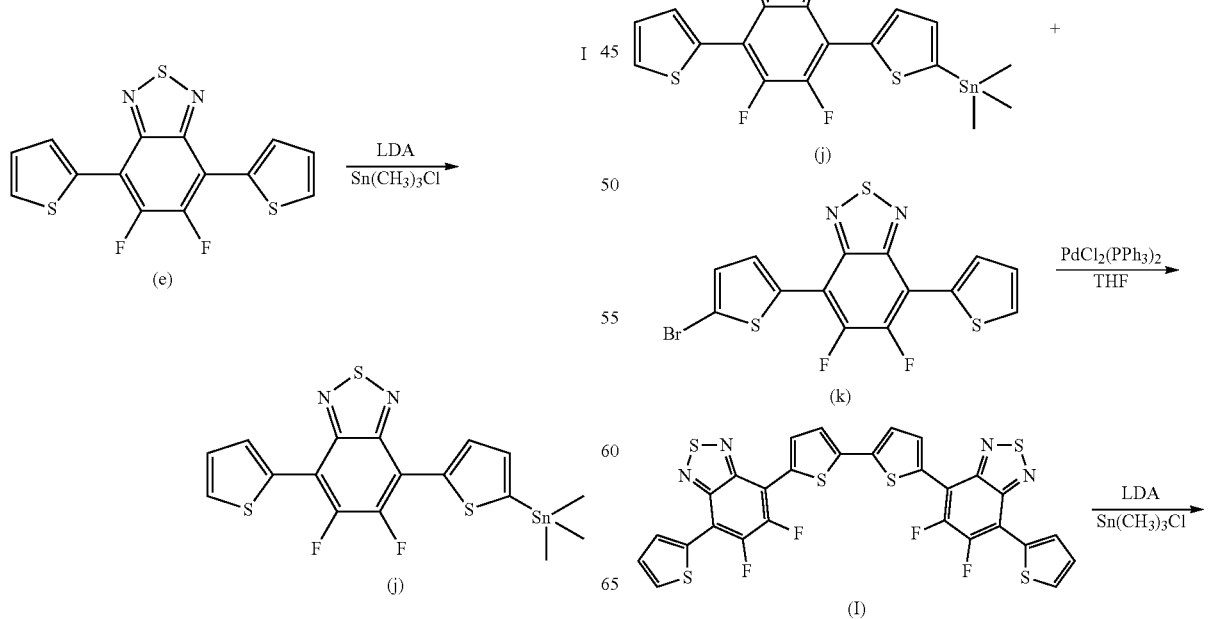

-continued

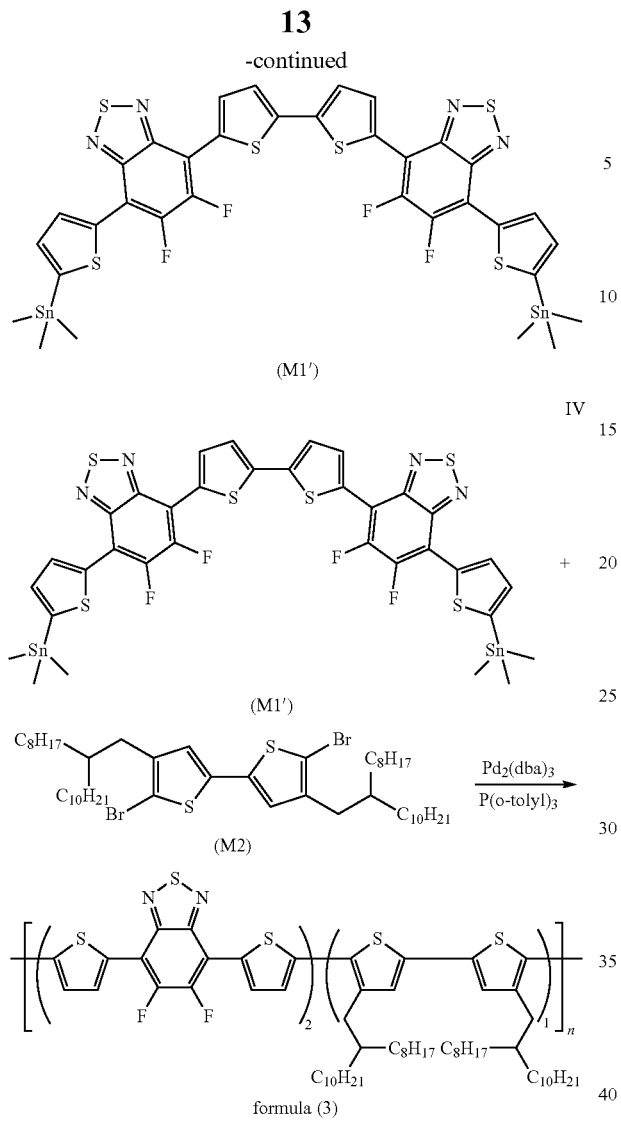

Specifically, in step I and step II of the possible synthesis reaction formula, the compound (e) may be synthesized according to the abovementioned contents, and a reaction formula thereof is as follows:

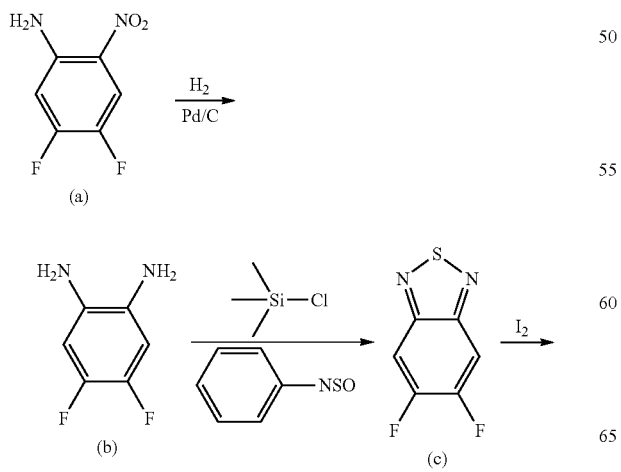

-continued

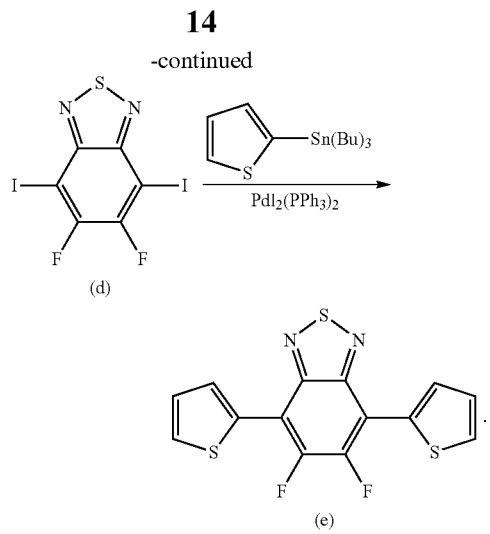

After the synthesis of the compound (e) is completed, the step I is firstly performed, such that the compound (e) is reacted with LDA and chlorotrimethylstannane under −78° C. to form a compound (j). On the other hand, step II is performed, such that the prepared compound (e) undergoes a bromination reaction with NBS while using THF as solvent, so as to form a compound (k). Subsequently, a step III is performed, the compound (j) undergoes a coupling reaction with the compound (k) in a palladium catalysis while using THF as solvent and bis(triphenylphosphine)palladium dichloride as catalyst, so as to form a compound (l). After the compound (l) is formed, the compound (l) is reacted with LDA and chlorotrimethylstannane under −78° C. to form a monomer (M1'). It should be noted that, in correspondence to the polymerizing monomer represented by r in the compound of formula (1), the monomer (M1') is namely a monomer when r is 2. Therefore, a step IV is lastly performed, the monomer (M1') and the monomer (M2) undergo a microwave polymerization with tris(dibenzylideneacetone)dipalladium and tris(2-methylphenyl)phosphine in the focused microwave synthesizer, so as to synthesize a polymer compound of formula (3), wherein the monomer (M2) may be synthesized according to the abovementioned contents, and a reaction formula thereof is as follows:

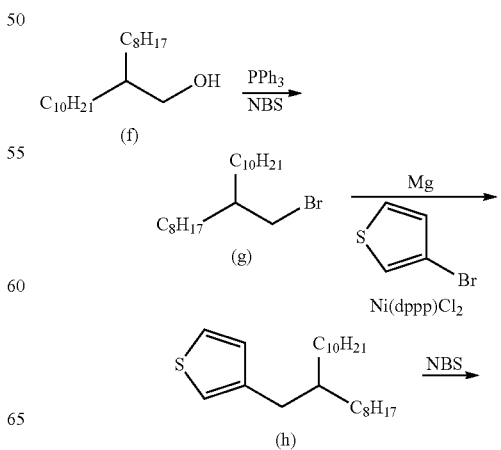

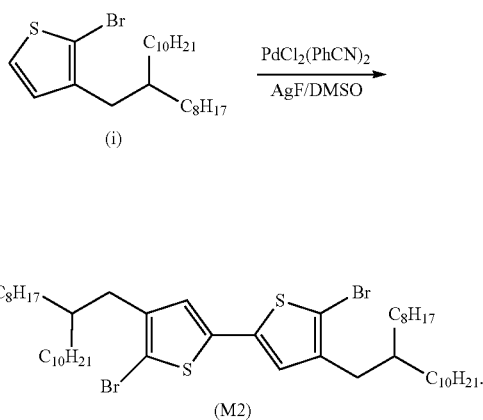

(i)

(M2)

It is noted that the polymer compound PTh$_4$FBT of formula (2) obtained in the synthesis example 1 is corresponded to the polymer compound represented by formula (1) when r is 1 and s is 1. The polymer compound of formula (3) obtained in the synthesis example 2 is corresponded to the polymer compound represented by formula (1) when r is 2 and s is 1; but the invention is not limited thereto. One of ordinary skill in the art, according to the contents disclosed in the above-mentioned synthesis examples 1 and 2, should be able to understand the synthetic manner of any combination of r and s in the compound represented by formula (1) as r is a positive integer of 1 to 20 and s is a positive integer of 1 to 20. In other words, in addition to the polymer compound (in correspondence to the compound represented by formula (1) when r is 1 and s is 1) in the synthesis example 1 and the polymer compound (in correspondence to the compound represented by formula (1) when r is 2 and s is 1) in the synthesis example 2, the organic semiconductor material of the invention may also include a polymer compound when r is an integer from 3 to 20 and s is 1, a polymer compound when r is 1 and s is an integer from 2 to 20, or a polymer compound when r is an integer from 3 to 20 and s is an integer from 2 to 20.

Organic Semiconductor Material Characteristic Test

Characteristic test of the polymer compound PTh$_4$FBT of formula (2) obtained in the synthesis example 1 is performed herein, and detailed descriptions thereof are as follows.

Figure 2:
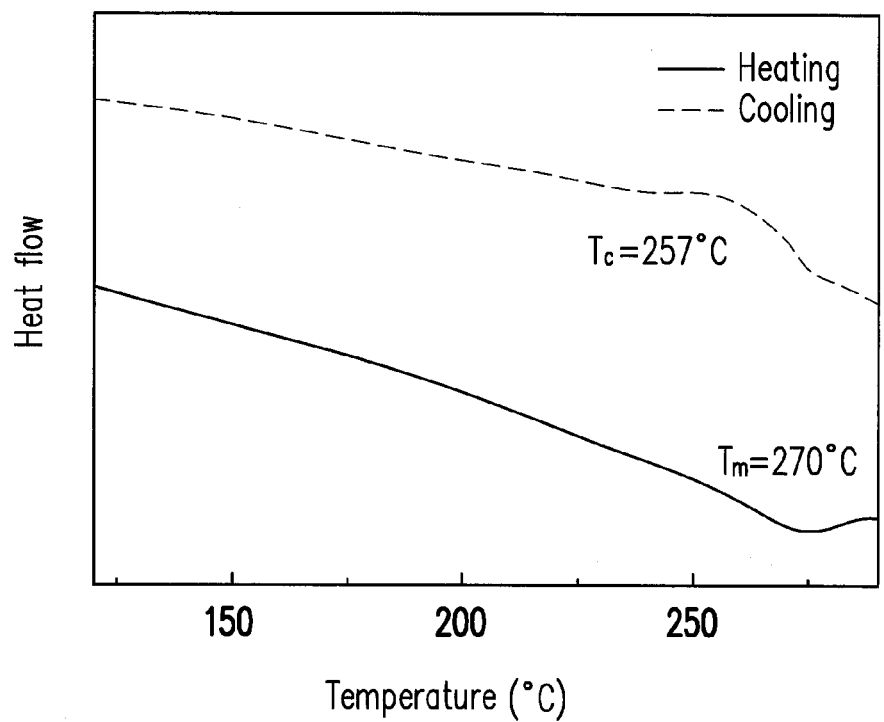
FIG. 2 is a differential scanning calorimetric graph of the polymer compound of formula (2).

FIG. 1 is a thermogravimetric graph of a polymer compound of formula (2). FIG. 2 is a differential scanning calorimetric graph of the polymer compound of formula (2). It can be known from FIG. 1 that a pyrolysis temperature of the polymer compound PTh$_4$FBT of formula (2) is 416° C., in other words, under the temperature of 416° C., the polymer compound PTh$_4$FBT of formula (2) is not prone to occur a pyrolysis and has a favorable thermal stability. Moreover, it can be known from FIG. 2, when the temperature is over 257° C., the polymer compound PTh$_4$FBT of formula (2) occurs a phase transition, but not the pyrolysis.

Thin Film Transistor

Figure 3:
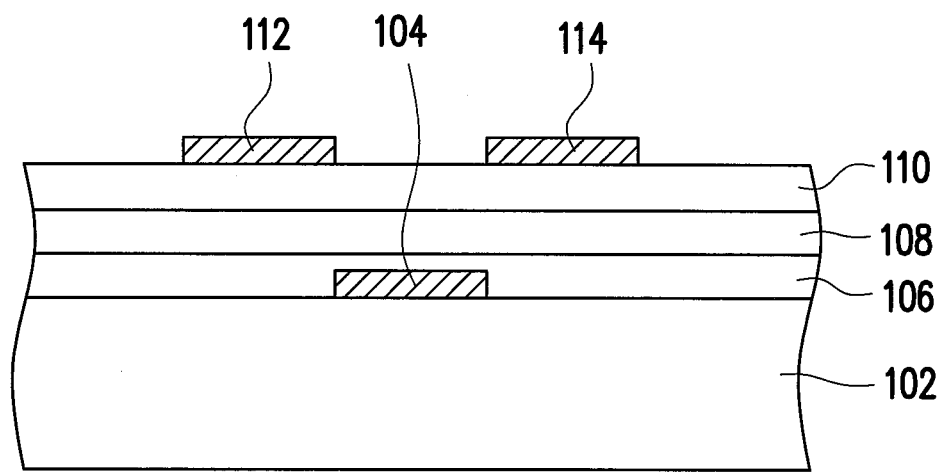
FIG. 3 is a cross-sectional schematic diagram illustrating a thin film transistor according to an embodiment of the invention.

FIG. 3 is a cross-sectional schematic diagram illustrating a thin film transistor according to an embodiment of the invention. Referring to FIG. 3, a thin film transistor 100 includes a gate 104, a drain 112, a source 114 and an organic semiconductor layer 110. Moreover, the thin film transistor 100 further includes a substrate 102, a dielectric layer 106 and a self-assembly monolayer (SAM) 108.

The substrate 102, for example, is a silicon substrate, a glass substrate, a plastic substrate or other flexible substrate. The gate 104 is located on the substrate 102. A material of the gate 104, for example, is metal or other non-metallic material with a high thermal conductivity coefficient. The dielectric layer 106 covers the gate 104 and is located between the gate 104 and the organic semiconductor layer 110. A material of the dielectric layer 106, for example, is silicon oxide, silicon nitride or other proper dielectric material. The self-assembly monolayer 108 is located on the dielectric layer 106 and between the organic semiconductor layer 110 and the dielectric layer 106. The self-assembly monolayer 108 has a characteristic of changing a surface energy of the dielectric layer 106, and thereby improve an effect of a molecular arrangement in the organic semiconductor layer 110.

The organic semiconductor layer 110 is located on the self-assembly monolayer 108. The drain 112 and the source 114 are each located on the organic semiconductor layer 110. In other words, the organic semiconductor layer 110 is located between the gate 104, the source 114 and the drain 112. A material of the drain 112 and the source 114, for example, is metal.

Moreover, the organic semiconductor layer 110 includes the above-mentioned organic semiconductor material. In other words, the organic semiconductor layer 110 includes the organic semiconductor material represented by formula (1):

formula (1)

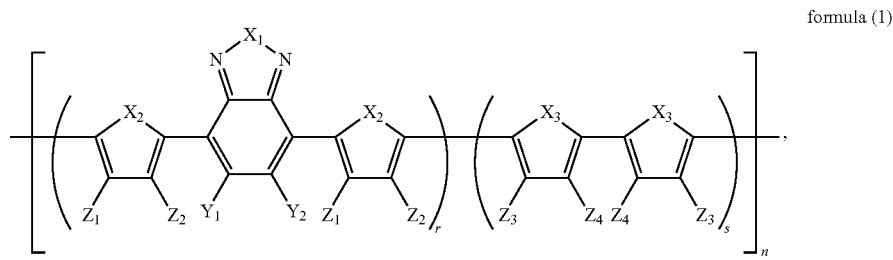

wherein r and s each independently represent a positive integer of 1 to 20, n represents a positive integer of 2 to 10000, $X_1$, $X_2$ and $X_3$ each independently represent O, S, Se, Te, NR, RCR, RSiR, RGeR or RSnR, $Y_1$ and $Y_2$ each independently represent H, F, Cl, CF3, haloalkyl, CN, R, OR, SR, COOR or COR, and $Z_1$, $Z_2$, $Z_3$ and $Z_4$ each independently represent H, F, Cl, $CF_3$, haloalkyl, CN, R, OR, SR, COOR or COR, wherein r represents alkyl group. However, the relevant description and the synthesis method of the organic semiconductor material are already described in detail at the above embodiments, and are not to be repeated herein.

Furthermore, the thin film transistor 100 illustrated in FIG. 3, for example, is a bottom gate structure, but the invention is not limited thereto. In other embodiments, the thin film transistor 100 may also, for example, be a top gate structure.

In order to explain effects of the thin film transistor in using the organic semiconductor material, a practical example is included below for the purpose of description.

Practical Example

Herein, the structure of the used thin film transistor is as shown in FIG. 3, wherein the substrate is a silicon substrate, a material of the gate is silicon, a material of the dielectric layer is silicon oxide, a material of the self-assembly monolayer is octadecyltrichlorosilane (ODTS), a material of the organic semiconductor layer is the polymer compound of formula (2), and a material of the source and the drain is gold (40 nm). In addition, after the polymer compound of formula (2) is coated, a heat treatment is performed for 10 minutes under a temperature of 200° C., so as to form the organic semiconductor layer in the thin film transistor of the present practical example.

$I_{DS}$-$V_{DS}$ Characteristic Measurement of Thin Film Transistor

Firstly, a semiconductor parameter analyzer (4156C, Agilent Technologies) is used to perform a characteristic measurement of drain/source current ($I_{DS}$) versus drain/source voltage ($V_{DS}$) for the thin film transistor by using three probes to respectively contact the source, the drain and the gate. Next, after the thin film transistor described in the above practical example has undergone a condition of being exposed to an atmosphere and not encapsulated for 40 days, the semiconductor parameter analyzer (4156C, Agilent Technologies) is again used to perform the $I_{DS}$-$V_{DS}$ characteristic measurement to the thin film transistor. Detailed measurement results are explained below in references to FIG. 4, FIG. 5 and Table 1.

Figure 4:
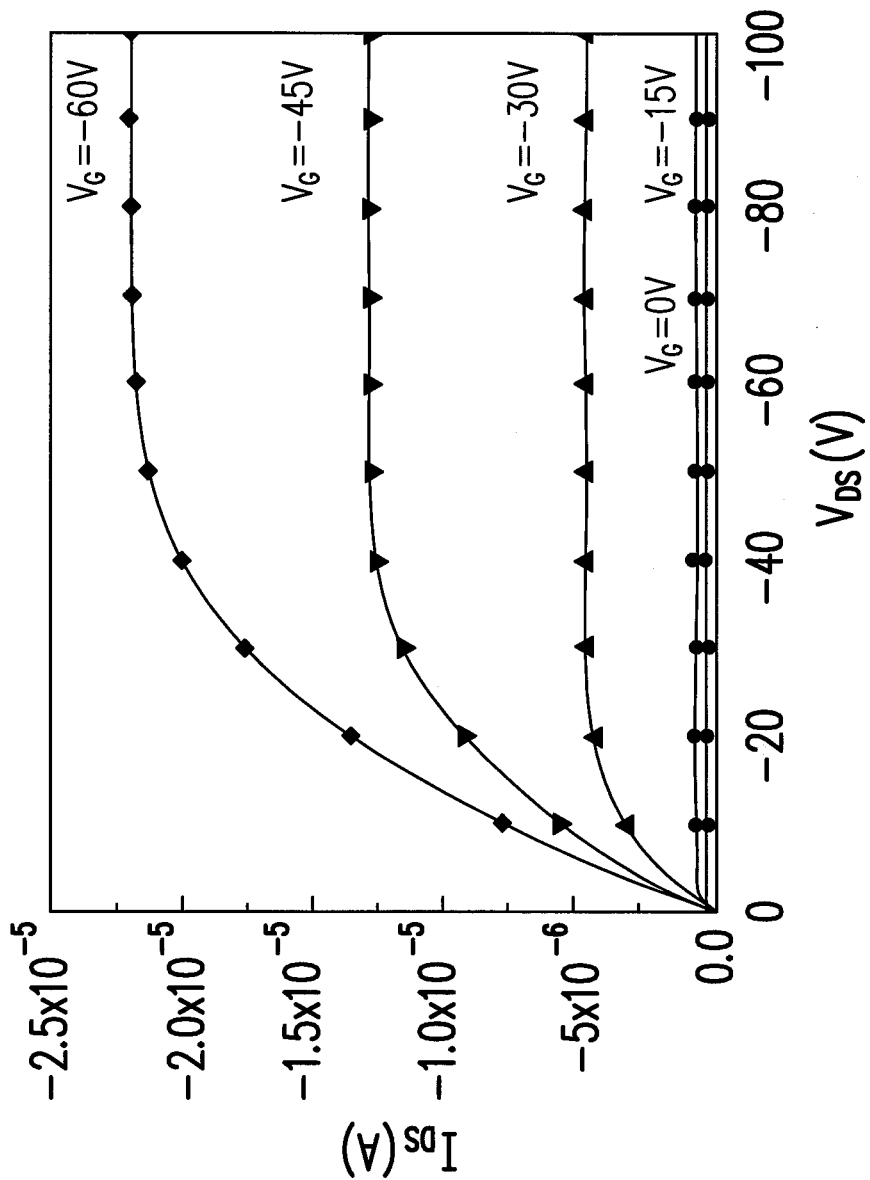
FIG. 4 is a graph illustrating a relationship of drain/source current ($I_{DS}$) versus drain/source voltage ($V_{DS}$) of the thin film transistor according to a practical example of the invention.

FIG. 4 is a graph illustrating a relationship of drain/source current ($I_{DS}$) versus drain/source voltage ($V_{DS}$) of the thin film transistor according to the practical example of the invention. It can be known from FIG. 4 that the polymer compound of formula (2) demonstrates a typical p-type semiconductor material characteristic: a linear region and a saturation region are shown in an output curve, wherein a region of $I_{DS}$ that increases with the increase in $V_{DS}$ is the linear region, and a region of $I_{DS}$ that dose not increase with the increase in $V_{DS}$ is the saturation region.

Figure 5:
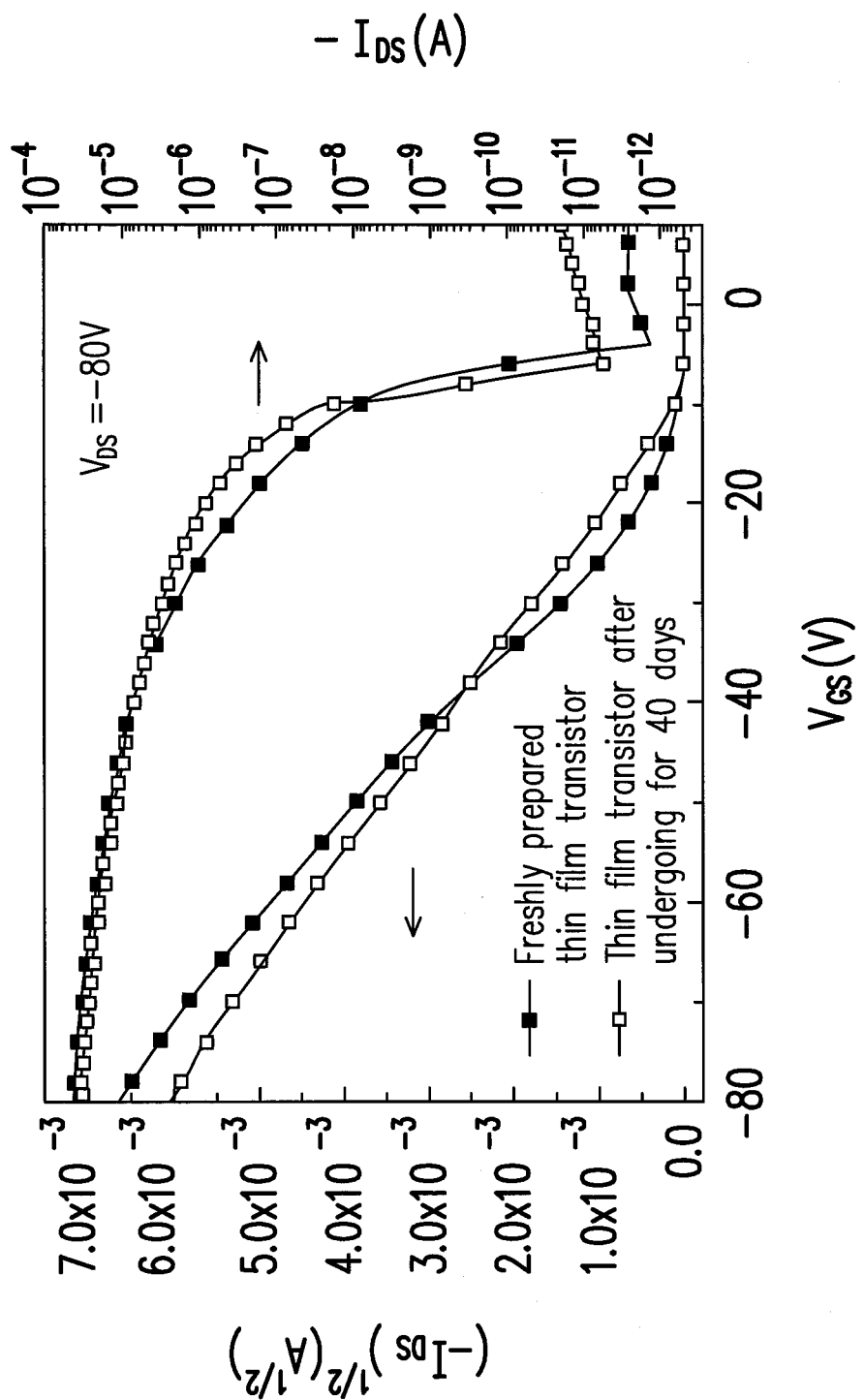
FIG. 5 is a graph illustrating relationships of drain/source current square root (($I_{DS}$)$^{1/2}$(A)$^{1/2}$) and drain/source current ($I_{DS}$) versus gate/source voltage ($V_{GS}$) after the thin film transistor has undergone a condition of being under an atmosphere and not encapsulated for 40 days according to the practical example of the invention.

FIG. 5 is a graph illustrating relationships of drain/source current square root $((I_{DS})^{1/2}(A)^{1/2})$ and drain/source current ($I_{DS}$) versus gate/source voltage ($V_{GS}$) after the thin film transistor has undergone the condition of being exposed under the atmosphere and not encapsulated for 40 days according to the practical example of the invention, wherein the drain/source voltage ($V_{DS}$) is −80 V. Specifically, a calculation formula of the drain/source current at the saturation region is shown as follows:

$$I_{DS} = \frac{\mu_n C_{ox}}{2} \frac{W}{L}(V_{GS} - V_{th})^2,$$

wherein, $I_{DS}$ is the source/drain current, μ is a charge mobility, $C_{ox}$ is a capacitance value generated by the dielectric layer, W is a channel width, L is a channel length, $V_{GS}$ is the gate/source voltage, and $V_{th}$ is a threshold voltage of the thin film transistor. It can be known from the above formula that an equation obtained after plotting a graph using $(I_{DS})^{1/2}$ versus $V_{GS}$, the charge mobility may be calculated from the slope, and an intercept of the x axis is the threshold voltage.

Moreover, it can be known from FIG. 5 that the freshly prepared thin film transistor, in comparison to the thin film transistor that has undergone the condition of being exposed to the atmosphere and not encapsulated for 40 days, a conversion curve for whether drain/source current square root $((I_{DS})^{1/2}(A)^{1/2})$ versus gate/source voltage ($V_{Gs}$) or drain/source current ($I_{DS}$) versus gate/source voltage ($V_{GS}$) is substantially the same. Namely, the thin film transistor of the present practical example after undergoing the condition of being exposed to the atmosphere and not encapsulated for 40 days may still have favorable semiconductor characteristics.

Next, Table 1 shows the charge mobility, the on-current and off-current ratio ($I_{on}/I_{off}$) and the threshold voltage test results for the thin film transistor of the practical example of the invention after undergoing the condition of being exposed to the atmosphere and not encapsulated for 40 days.

TABLE 1

|  | μ ($CM^2/Vs$) | $I_{on}/I_{off}$ | $V_{th}$ (V) |
| --- | --- | --- | --- |
| Freshly prepared thin film transistor | 0.29 | $5.1 \times 10^7$ | −18.4 |
| The thin film transistor after being treated for 40 days in the condition | 0.15 | $6.6 \times 10^6$ | −10.3 |

In general, as the charge mobility of the organic semiconducting polymer material reaches above 0.05 ($cm^2/Vs$), it means that the organic semiconducting polymer material has a favorable charge transport effect, and the on-current and off-current ratio must reach above $10^6$ for the practical application of the thin film transistor. Moreover, in general, a conventional thin film transistor using an organic semiconductor material is prone to an influence of water and oxygen when being exposed to the atmosphere, and thereby damages the semiconductor characteristics of the thin film transistor.

It can be known from Table 1, the charge mobility of the thin film transistor of the present practical example is 0.29 ($cm^2/Vs$), and the charge mobility of the thin film transistor after undergoing the condition of being exposed to the atmosphere and not encapsulated for 40 days is 0.15 ($cm^2/Vs$); and therefore, the organic semiconductor material of the invention indeed has a favorable charge transport effect, and still has the favorable charge transport effect even after undergoing the condition of being exposed to the atmosphere and not encapsulated for 40 days. Namely, the organic semiconductor material of the invention has a low sensitivity to the water and the oxygen in the atmosphere, and the stability of the thin film transistor of the present practical example is excellent.

Moreover, as shown in Table 1, the on-current and off-current ratio of the thin film transistor of the present practical example is $5.1 \times 10^7$, the on-current and off-current ratio of the thin film transistor after undergoing the condition of being exposed to the atmosphere and not encapsulated for 40 days is $6.6 \times 10^6$; and therefore the thin film transistor of the invention even if after undergoing the condition of being exposed to the atmosphere and not encapsulated for 40 days stills has a favorable on-current and off-current ratio. Namely, the thin film transistor of the present practical example of the invention has a low sensitivity to the water and the oxygen in the atmosphere, and thus has the favorable stability.

In summary, the organic semiconductor material and the thin film transistor of the abovementioned embodiments are a novel organic semiconducting polymer material and a novel organic thin film transistor. Moreover, the organic semiconductor material and the thin film transistor provided in the abovementioned embodiments have the favorable charge transport effects and low sensitivities to the water and the oxygen in the atmosphere, and thus have the favorable stabilities.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. An organic semiconductor material comprising a compound as represented by formula (1):

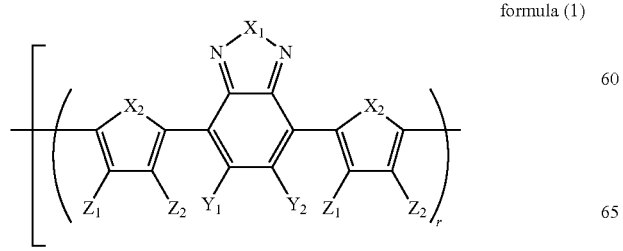

formula (1)

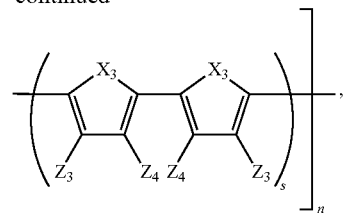

wherein r represents a positive integer of 2 to 20 and s represents a positive integer of 1 to 20, or r represents a positive integer of 1 to 20 and s represents a positive integer of 2 to 20; n represents a positive integer of 2 to 10000; $X_1$, $X_2$ and $X_3$ each independently represent O, S, Se, Te, NR, RCR, RSiR, RGeR or RSnR; $Y_1$ and $Y_2$ each independently represent H, F, Cl, $CF_3$, haloalkyl, CN, R, OR, SR, COOR or COR; and $Z_1$, $Z_2$, $Z_3$ and $Z_4$ each independently represent H, F, Cl, $CF_3$, haloalkyl, CN, R, OR, SR, COOR or COR, wherein R represents alkyl group.

2. A thin film transistor comprising:
a gate, a drain and a source; and
an organic semiconductor layer located between the gate, the source and the drain, wherein the organic semiconductor layer comprises an organic semiconductor material represented by formula (1):

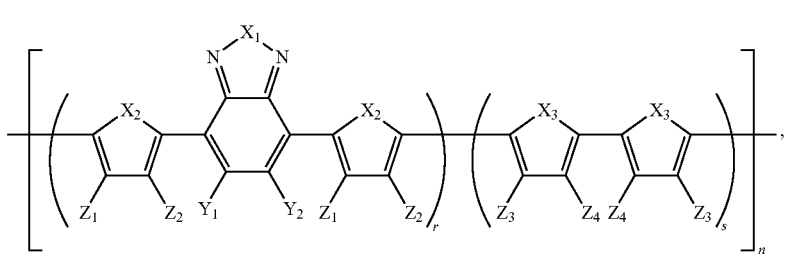

formula (1)

wherein r represents a positive integer of 2 to 20 and s represents a positive integer of 1 to 20, or r represents a positive integer of 1 to 20 and s represents a positive integer of 2 to 20; n represents a positive integer of 2 to 10000; $X_1$, $X_2$ and $X_3$ each independently represent O, S, Se, Te, NR, RCR, RSiR, RGeR or RSnR; $Y_1$ and $Y_2$ each independently represent H, F, Cl, $CF_3$, haloalkyl, CN, R, OR, SR, COOR or COR; and $Z_1$, $Z_2$, $Z_3$ and $Z_4$ each independently represent H, F, Cl, $CF_3$, haloalkyl, CN, R, OR, SR, COOR or COR, wherein R represents alkyl group.

3. The thin film transistor as recited in claim 2 further comprising a dielectric layer located between the gate and the organic semiconductor layer.

4. The thin film transistor as recited in claim 3 further comprising a self-assembly monolayer located between the organic semiconductor layer and the dielectric layer.

* * * * *